(12) United States Patent
Platzgummer et al.

(10) Patent No.: US 9,495,499 B2
(45) Date of Patent: Nov. 15, 2016

(54) COMPENSATION OF DOSE INHOMOGENEITY USING OVERLAPPING EXPOSURE SPOTS

(71) Applicant: IMS Nanofabrication AG, Vienna (AT)

(72) Inventors: Elmar Platzgummer, Vienna (AT); Rafael Reiter, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 14/726,243

(22) Filed: May 29, 2015

(65) Prior Publication Data

US 2015/0347660 A1    Dec. 3, 2015

(30) Foreign Application Priority Data

May 30, 2014   (EP) .................................... 14170611

(51) Int. Cl.
  *G06F 17/50*   (2006.01)
  *H01J 37/304*   (2006.01)
  *H01J 37/317*   (2006.01)

(52) U.S. Cl.
  CPC ....... *G06F 17/5072* (2013.01); *G06F 17/5081* (2013.01); *H01J 37/304* (2013.01); *H01J 37/3177* (2013.01); *H01J 2237/24535* (2013.01); *H01J 2237/31761* (2013.01)

(58) Field of Classification Search
  CPC ............ G06F 17/5072; G06F 17/5081; H01J 37/3177; H01J 37/304; H01J 2237/24535; H01J 2237/31761
  See application file for complete search history.

(56) References Cited

U.S. PATENT DOCUMENTS

| 1,033,741 A | 7/1912 | Sims |
| 1,420,104 A | 6/1922 | Howe et al. |
| 1,903,005 A | 3/1933 | Mccuen |
| 2,187,427 A | 1/1940 | Middleton |
| 2,820,109 A | 1/1958 | Dewitz |
| 2,920,104 A | 1/1960 | Brooks et al. |

(Continued)

FOREIGN PATENT DOCUMENTS

| CN | 202204836 U | 4/2012 |
| EP | 1033741 A2 | 9/2000 |

(Continued)

OTHER PUBLICATIONS

European Search Report for Application 09450211.9-1226, report dated Sep. 14, 2010, 4 pgs.

(Continued)

*Primary Examiner* — Naum B Levin
(74) *Attorney, Agent, or Firm* — KPPB LLP

(57) ABSTRACT

An exposure pattern is computed which is used for exposing a desired pattern on a target by means of a particle beam and a blanking aperture array in a particle-optical lithography apparatus, taking into account a non-uniform current dose distribution as generated by the beam over the positions of the apertures of the blanking aperture array: From the desired pattern a nominal exposure pattern is calculated as a raster graphics comprising nominal dose values for the pixels of the raster graphics; based on a map of the current dose distribution, which correlates each aperture with a current factor describing the current dose of the beam at the location of the aperture, a compensated dose value is calculated for each pixel; and for each pixel, a discrete value is determined by selecting a value from a discrete gray scale so as to approximate the compensated dose value.

16 Claims, 13 Drawing Sheets

(56) References Cited

U.S. PATENT DOCUMENTS

| | | | |
|---|---|---|---|
| 3,949,265 A | 4/1976 | Holl | |
| 4,467,211 A | 8/1984 | Smith et al. | |
| 4,735,881 A | 4/1988 | Kobayashi et al. | |
| 4,899,060 A | 2/1990 | Lischke | |
| 5,103,101 A | 4/1992 | Berglund et al. | |
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,847,959 A | 12/1998 | Veneklasen et al. | |
| 5,857,815 A | 1/1999 | Bailey et al. | |
| 5,876,902 A | 3/1999 | Veneklasen et al. | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley et al. | |
| 6,252,339 B1 | 6/2001 | Kendall | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2* | 9/2003 | Parker | B82Y 10/00 250/396 R |
| 6,767,125 B2 | 7/2004 | Midas et al. | |
| 6,768,123 B2 | 7/2004 | Giering | |
| 6,768,125 B2* | 7/2004 | Platzgummer | B82Y 10/00 250/492.1 |
| 6,786,125 B2 | 9/2004 | Imai | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson et al. | |
| 7,214,951 B2 | 5/2007 | Stengl et al. | |
| 7,276,714 B2 | 10/2007 | Platzgummer et al. | |
| 7,459,247 B2 | 12/2008 | Bijnen et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,741,620 B2 | 6/2010 | Doering et al. | |
| 7,772,574 B2* | 8/2010 | Stengl | B82Y 10/00 250/492.1 |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Fragner et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2* | 9/2012 | Sczyrba | B82Y 10/00 430/296 |
| 8,258,488 B2* | 9/2012 | Platzgummer | B82Y 10/00 250/492.1 |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2* | 8/2013 | Wieland | B82Y 10/00 250/310 |
| 8,546,767 B2 | 10/2013 | Platzgummer et al. | |
| 8,563,942 B2 | 10/2013 | Platzgummer | |
| 8,598,544 B2* | 12/2013 | Van De Peut | B82Y 10/00 250/492.2 |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,188,874 B1 | 11/2015 | Johnson | |
| 9,269,543 B2 | 2/2016 | Reiter et al. | |
| 9,443,699 B2 | 9/2016 | Platzgummer et al. | |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0058536 A1 | 3/2004 | Ki | |
| 2004/0119021 A1 | 6/2004 | Parker et al. | |
| 2004/0157407 A1 | 8/2004 | Tong et al. | |
| 2004/0169147 A1 | 9/2004 | Ono et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans et al. | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0237460 A1 | 10/2008 | Fragner et al. | |
| 2008/0257096 A1 | 10/2008 | Zhu et al. | |
| 2008/0260283 A1 | 10/2008 | Ivansen | |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1 | 5/2010 | Fragner et al. | |
| 2010/0178602 A1 | 7/2010 | Seto et al. | |
| 2010/0187434 A1 | 7/2010 | Platzgummer et al. | |
| 2010/0288938 A1 | 11/2010 | Platzgummer | |
| 2011/0053087 A1 | 3/2011 | Nielsen et al. | |
| 2011/0073782 A1* | 3/2011 | Wieland | B82Y 10/00 250/492.22 |
| 2011/0204253 A1 | 8/2011 | Platzgummer et al. | |
| 2011/0226968 A1 | 9/2011 | Platzgummer | |
| 2012/0076269 A1 | 3/2012 | Roberts et al. | |
| 2012/0085940 A1 | 4/2012 | Matsumoto | |
| 2012/0211674 A1 | 8/2012 | Kato | |
| 2012/0286169 A1* | 11/2012 | Van De Peut | B82Y 10/00 250/396 R |
| 2012/0286170 A1 | 11/2012 | Van De Peut et al. | |
| 2012/0288787 A1 | 11/2012 | Choi et al. | |
| 2013/0157198 A1 | 6/2013 | Yoshikawa et al. | |
| 2013/0164684 A1 | 6/2013 | Yamanaka | |
| 2013/0198697 A1 | 8/2013 | Hotzel et al. | |
| 2013/0252145 A1 | 9/2013 | Matsumoto et al. | |
| 2013/0253688 A1 | 9/2013 | Matsumoto et al. | |
| 2014/0042334 A1 | 2/2014 | Wieland | |
| 2014/0197327 A1 | 7/2014 | Platzgummer | |
| 2014/0240732 A1 | 8/2014 | Tinnemans et al. | |
| 2014/0322927 A1 | 10/2014 | Morita | |
| 2014/0346369 A1 | 11/2014 | Matsumoto | |
| 2015/0021493 A1 | 1/2015 | Platzgummer | |
| 2015/0028230 A1 | 1/2015 | Platzgummer | |
| 2015/0069260 A1 | 3/2015 | Platzgummer | |
| 2015/0243480 A1 | 8/2015 | Yamada | |
| 2015/0248993 A1 | 9/2015 | Reiter et al. | |
| 2015/0311030 A1 | 10/2015 | Platzgummer et al. | |
| 2015/0311031 A1 | 10/2015 | Platzgummer et al. | |
| 2016/0012170 A1 | 1/2016 | Platzgummer | |

(56) References Cited

U.S. PATENT DOCUMENTS

2016/0013019 A1    1/2016    Platzgummer
2016/0071684 A1    3/2016    Platzgummer et al.

FOREIGN PATENT DOCUMENTS

| | | |
|---|---|---|
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for application 09450212.7, report dated Sep. 28, 2010, 9 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851; report dated Oct. 16, 2014; 1 page.
European Search Report for Application 14199183, report dated Jun. 19, 2015, 2 pgs.
European Search Report for Application 15164770, report dated Sep. 18, 2015; 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for Application 08450077.6, report dated Jan. 29, 2010.
European Search Report for Application 141501197.7, report dated Jun. 6, 2014, 2 pgs.
European Search Report for Application 10450070.7, report dated May 7, 2012, 2 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and reisitless nanopatterning", Journal of Micromechanics and Microengineering, 21 (2001), pp. 1-8.
Li, H. Y. et al., "Through-Silicon Interposer Technology for Heterogeneous Integration", Future Fab Intl., Issue 45 (Apr. 25, 2013).
Paraskevopoulos, A. et al., "Scalable (24-140 Gbps) optical data link, well adapted for future maskless lithography applications", Proc. SPIE vol. 7271, 72711 I (2009).
Platzgummer, Elmar et al., "eMET POC: Realization of a proof-of-concept 50 keV electron multibeam Mask Exposure Tool", Proc. of SPIE vol. 8166, 816622-1, 2011.
Platzgummer et al., "eMET—50keV electron Mask Exposure Tool Development based on proven multi-beam projection technology", Proc. of SPIE , vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for Application 15159397.7, report dated Sep. 28, 2015, 8 pgs.
European Search Report for Application 15159617.8, report dated Oct. 19, 2015, 4 pgs.
Wheeler et al., "Use of Electron Beams in VLSI", G.E.C.Journal of Science and Technology, General Electric Company, Wembley, Middlesex, GB, vol. 48, No. 2, Jan. 1, 1982, pp. 103-107, XP000820522.

\* cited by examiner

COMPENSATION OF DOSE INHOMOGENEITY USING OVERLAPPING EXPOSURE SPOTS

CROSS-REFERENCE TO RELATED APPLICATION

The present application claims priority to European Application No. 14170611.9, filed May 30, 2014. The disclosure of European Application No. 14170611.9 is incorporated by reference herein its entirety.

FIELD OF THE INVENTION AND DESCRIPTION OF PRIOR ART

Embodiments of the invention relate to a charged-particle multi-beam exposure apparatus for forming a pattern on a surface of a substrate or target by means of a beam of energetic electrically charged particles. More in detail, in many embodiments, the invention relates to a method for computing an exposure pattern for exposing a desired pattern on a target in a charged-particle multi-beam lithography apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, said particle beam having a distribution of current dose for the plurality of blanking apertures of said aperture array; in the pattern definition device said plurality of blanking apertures is preferably arranged in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a respective value selected from a discrete gray scale; during a writing process of said desired pattern, a sequence of exposure intervals is made, wherein in each exposure interval the blanking apertures are imaged onto the target so as to generate a corresponding plurality of aperture images, wherein the position of aperture images is kept fixed relative to the target at the position of a pixel during an exposure interval, but between exposure intervals the position of aperture images is shifted over the target, thus exposing the multitude of pixels within said image area on the target. Numerous embodiments of the invention aim at developing said method so as to take into account a deviation of the dose distribution of the particle beam from a constant nominal current dose value.

The mentioned writing strategy and a development including overlapping exposure spots ("interlocking grids") is the subject of various patent disclosures in the name of the applicant, in particular U.S. Pat. No. 7,276,714; U.S. Pat. No. 7,781,748; U.S. Pat. No. 7,777,201; and U.S. Pat. No. 8,115,183.

The applications of a multi-beam writing mode with an addressable pattern definition device for direct pattern transfer by charged particle beam projection has been subject of investigation and development since the 1980s. Such devices will be advantageous in the field of particle-beam lithography used in semiconductor technology. Therein, lithography apparatus are used to define structures on a target, e.g. a silicon wafer or a 6" mask blank. (Throughout this disclosure, the terms target and substrate are used interchangeably.) In order to define a desired pattern on a substrate, the substrate is covered with a layer of a radiation sensitive resist. Afterwards, a desired structure is imaged onto the resist by means of a lithography apparatus, and the resist is then patterned by partial removal (in the case of a positive resist) according to the pattern defined by the previous exposure step and then used as a mask for further structuring processes such as etching. In other applications the pattern may be generated by direct patterning without a resist, for example ion milling or reactive ion beam etching or deposition.

In 1997, I. L. Berry et al., in J. Vac. Sci. Technol. B, 15(6), 1997, pp. 2382-2386, presented a writing strategy based on a blanking aperture array and an ion projection system. Arai et al., U.S. Pat. No. 5,369,282, discuss an electron-beam exposure system using a so called blanking aperture array (BAA) which plays the role of a pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner to that the apertures form staggered lines as seen along the scanning direction. Thus, the staggered lines sweep continuous lines on the substrate surface without leaving gaps between them as they move relative to the substrate, thus covering the total area to be exposed on the substrate.

The above-mentioned article of Berry et al. describes a pattern definition device comprising a "programmable aperture array" with an array of 3000×3000 apertures of 5 μm side length with an n=4 alignment of rows and staggered lines. The article proposes to use a 200× demagnification ion-optical system for imaging the apertures of the BAA onto the substrate.

Starting from Berry's concept, E. Platzgummer et al., in U.S. Pat. No. 6,768,125, presented a multi-beam direct write concept, dubbed PML2 (short for "Projection Maskless Lithography"), employing a pattern definition device comprising a number of plates stacked on top of the other, among them an aperture array means and a blanking means. These plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768,125 with regard to the architecture and operation of the pattern definition device is herewith included by reference as part of this disclosure.

The main advantage of the PML2 multi-beam direct write concept is the large enhancement of the writing speed compared to single beam writers (multi-beam approach means a charged particle beam consisting of a plurality of sub-beams dynamically structured by an aperture plate including switch-able blanker devices). The improved productivity mainly arises from the following features as compared to relative state-of-the-art technology:

The operating current density is significantly reduced (relaxed source requirement);
The operating single beam blanking rate can be limited to the low MHz regime;

The importance of space charge is reduced (since the current is distributed to a large cross section when a broad beam is used);

Enhanced pixel transfer rate due to parallel writing strategy (instead of sequential raster scan);

High degree of redundancy possible by virtue of the plurality of beamlets (also enables generation of gray scale values of exposure).

The state of the art PML2 concept is a strategy where the substrate is moved continuously, and the projected image of a structured beam generates all of the gray pixels by subsequent exposures of apertures located in a row. As described in U.S. Pat. No. 7,777,201 by the applicant, a writing strategy, referred to as "trotting mode", is proposed in which for each pixel one or a few beamlets along the (mechanical) scanning direction are used to generate the entire set of the gray pixels. The advantage of this variant is the reduced complexity of the CMOS structure and improved data management.

SUMMARY OF THE INVENTION

As has been well established in the state of the art, the dose rate of each beamlet is unavoidably influenced by the local current density of the illuminating beam generated by a charged particle source, which is basically a radial function of the distance from the optical axis, but can also have general position-dependent components that arise from source emission inhomogeneity or other effects that relate to a, possibly also time dependent, variation of the illumination system. Therefore, a leveling of the dose rate over the area of the aperture array is highly desirable. Current density variation due to the transfer function of the charged-particle optics can be pre-calculated quite accurately using state-of-the-art charged-particle optics calculation routines which include space charge and very precise field calculation. Such dose inhomogeneity can be corrected with stationary methods such as described by U.S. Pat. No. 8,258,488 by the inventor. However, time dependent or varying effects cannot be covered by the solution as described in U.S. Pat. No. 8,258,488, but require a solution that includes an on-line feedback of the current density distribution and an on-line algorithm that allows to compensate for it.

In view of the above, it is the task of many embodiments of the present invention to find a way to overcome the deficiencies of prior art and allow an improved control of the dose delivered to a substrate (physical dose of each beam per gray level, taking into account the inhomogeneity of illumination and aperture sizes) in the multi-beam array in order to form an array of beamlets which, at its final position on the target, has a homogeneous dose increment per gray level over the complete range of the array of beamlets. In other words, a beamlet at the corner of the array should have virtually the same dose increment per gray level (i.e. transfer the same mean number of particles per exposure time period) as a beamlet in the center of the array. Furthermore, the task of many embodiments of the invention is to allow a very efficient compensation taking into account the coding of the writing data, based on the assumption of identical beamlets arranged on a regular grid, and which is feasible transiently without long-term storage of the writing data (i.e., in real-time), which may be done in an on-line data preparation module.

More specifically, several embodiments of the invention offer a method for computing an exposure pattern as described in the beginning, taking into account a deviation of the distribution of current dose of the beam with regard to the plurality of blanking apertures from a uniform nominal current dose value, i.e. from an ideal distribution assumed to be constant over said plurality of blanking apertures, the method comprising:

(i) providing a map of said distribution, correlating each aperture with a current factor, said current factor describing the current dose of the beam at the location of the respective aperture, which may be specified as absolute values or in relation to (preferably) the nominal current dose value, (ii) providing the desired pattern and calculating a nominal exposure pattern as a raster graphics defined on the multitude of pixels, said nominal exposure pattern being suitable to create a nominal dose distribution on the target realizing contour lines of the desired pattern and including for each pixel a respective nominal dose value y, (iii) calculating, for each pixel, a compensated dose value y' by dividing the respective nominal dose value by a compensation factor q corresponding to the current factor of the aperture corresponding to the respective pixel, (iv) determining, for each pixel, a discrete value by selecting a value from the discrete gray scale which approximates the compensated dose value, and (v) generating, from the nominal exposure pattern, a compensated exposure pattern suitable to expose the desired pattern by said writing process by substituting the discrete values determined in step iv for the nominal dose values.

This solution solves the above problem by using an algorithm to modify individual beam dose assignments; this is possible while they are pre-calculated in the course of the "on-line" rasterization. In this context the term "on-line rasterization" refers to the real-time rendering of a vector-based pattern file, typically the design data with customer specific pattern corrections, to a raster graphics array of discrete dose values (i.e. gray values) on the substrate. Depending on the current dose of the individual beamlets, which may vary across the array (caused by the inhomogeneities of the illumination system and aperture widths) and/or over time, the gray dose values are modified so as to take modified values which compensate the inhomogeneities of the current dose distribution from a uniform nominal value. Or, in short, a number of embodiments of the invention compensate a measurable dose inhomogeneity by suitable corrections during the rasterization process.

It is noted that in the present disclosure, the expression "current dose" (or short "dose") is used to denote an amount of electrical charge delivered within a certain time interval; unless specified otherwise, this time interval is the duration of one exposure step T1 (FIG. 7). In particular, each blanking aperture forms a respective beamlet which will deliver a certain current dose to a corresponding image aperture on the target (that is, during an exposure step). When considering the array of blanking apertures and the corresponding array of beamlets, the respective current doses are ideally uniform, but in reality will vary between apertures/beamlets; the respective doses are described by a position-dependent function, which is referred to as "current dose distribution", short "dose distribution" or simply "distribution".

According to the basic idea of various embodiments of the invention, the dose error compensation is done by adapting the dose per beamlet using a "current density map" of the illuminating beam (more correctly: "current dose map"), leading to a significant decrease of the error per dose increment delivered to the substrate despite the illumination inhomogeneity. The compensation method is considerably improved when the writing process uses a positioning of aperture images such that they mutually overlap (oversampling) since this offers a finer scale of discrete gray scales. Generally, the higher the degree of overlap, the better the compensation method according to numerous embodiments of the invention will work.

Thus, one preferred embodiment of the invention combines the above-described method of several embodiments of the invention with a writing method wherein the aperture images (i.e., exposure spots) are mutually overlapping on the target, and the aperture images have a nominal width which is a multiple of the distance between pixel positions of neighboring aperture images on the target. This combination allows to obtain a finer adaption of the discrete values in step iv to the desired pattern, reducing the residual error of the compensated exposure pattern, namely in that in step iv, for a pixel where the corresponding compensated dose value falls between two values of the discrete gray scale, said compensated dose value is approximated by assigning at least two different values of the discrete gray scale—e.g., either of the two values above and below the value to be approximated—to the aperture images affecting the image element corresponding to the respective pixel such that the total dose conferred to the image element (so as to emulate the average of the values thus assigned) reproduces the compensated dose value within a predetermined error width. Suitably, the predetermined error width which can be achieved may be the difference of the two values of the discrete gray scale divided by square of the value obtained as the quotient of the aperture image nominal width divided by said distance between center positions of neighboring aperture images on the target. The corresponding error width for the contour line positioning of the desired pattern is the square of the distance between center positions of neighboring aperture images on the target, divided by the product of the dose increment relative to the maximum dose and the aperture image nominal width.

One suitable way to determine a discrete value in step iv for each pixel is by selecting a value which is arithmetically closest to the compensated dose value among the values within the discrete gray scale.

According to a suitable aspect of many embodiments of the invention, steps ii through v, but at least steps iii through v, may be performed during a writing process in real time. In this case the associated calculations may be performed transiently, in particular without permanent storage of the data calculated.

Another advantageous aspect of a number embodiments of the invention relates to how the map (step i) is determined. For instance the map may be determined by means of a current measurement apparatus positioned in place of the target, while controlling the pattern definition device such that for each part of the map, which corresponds to the current dose value of specific blanking apertures respectively, only the beam parts corresponding to the respective blanking apertures will propagate to the current measurement apparatus.

Furthermore, the map may also include time-dependent values, namely, having a time dependency corresponding to an ageing function of the sensitivity of the target, such as a charged-particle beam sensitive resist layer present on the target. Alternatively or in combination, where the particle beam is generated from a source having a total current which may vary in time, the time-dependency may comprise a function corresponding to a fluctuation function of the total current emitted from the source. Such a fluctuation function may be updated, for instance, by means of measuring the current of the beam using a current measurement apparatus, such as the one described in the preceding paragraph.

Preferably the discrete gray scale set may be uniform for all aperture images and comprise evenly-spaced values from a predetermined a minimum value to a predetermined maximum value. In the disclosure below, the minimum and maximum values are taken to be 0 and 1, respectively, without loss of generality.

In one advantageous embodiment of the invention the map in step i is realized as a numeric array of values $\alpha(r)$ describing the relative error of said distribution from the nominal current dose value; then, in step iii, dividing by the current factor may be done by dividing by $(1+\alpha(r))$.

In a suitable variant of the compensation calculation, in step iii calculating a compensated dose value may be done by dividing the respective nominal dose value by the current factor of the aperture corresponding to the respective pixel only where the result is smaller than a predetermined maximal value; otherwise said maximal value is taken instead.

A further aspect of a number of embodiments of the invention considers a row-wise correction of the pixel data. A "row" is a line of apertures parallel to a scanning direction, i.e., corresponding to the direction of time-averaged movement of the position of aperture images over the target. To realize a row-wise correction, the current factor may comprise a row calibration factor which is uniform for each row, but may vary between rows. For instance, the row calibration factor of a row may be determined by means of a current measurement apparatus positioned in place of the target, while controlling the pattern definition device such that only the beamlets corresponding to the blanking apertures of the respective row will propagate to the current measurement apparatus; the row calibration factor is then taken as the total dose thus measured divided by a common reference value such as a minimum, maximum or average value of all row values. Another suitable way to determine a row calibration factor is by generating a line structure at the position of the target from the blanking apertures of the respective row, measuring a width of the line thus produced, and dividing said width by a reference width; in this case, for instance, the line structure may be measured directly by a metrology device at the position of the target, or the line structure may be evaluated through writing a patterned line structure on a target, comprising at least one pattern line corresponding to said respective row, and measuring and comparing a contour width of said at least on pattern line with regard to a common reference value such as a minimum, maximum or average value of all row values.

BRIEF DESCRIPTION OF THE DRAWINGS

In the following, a number of embodiments of the present invention are described in more detail with reference to the drawings, which schematically show.

DETAILED DESCRIPTION

It should be appreciated that embodiments of the invention are not restricted to the embodiments discussed in the following, which merely represent suitable implementations of the invention.

Lithographic Apparatus

Figure 1:
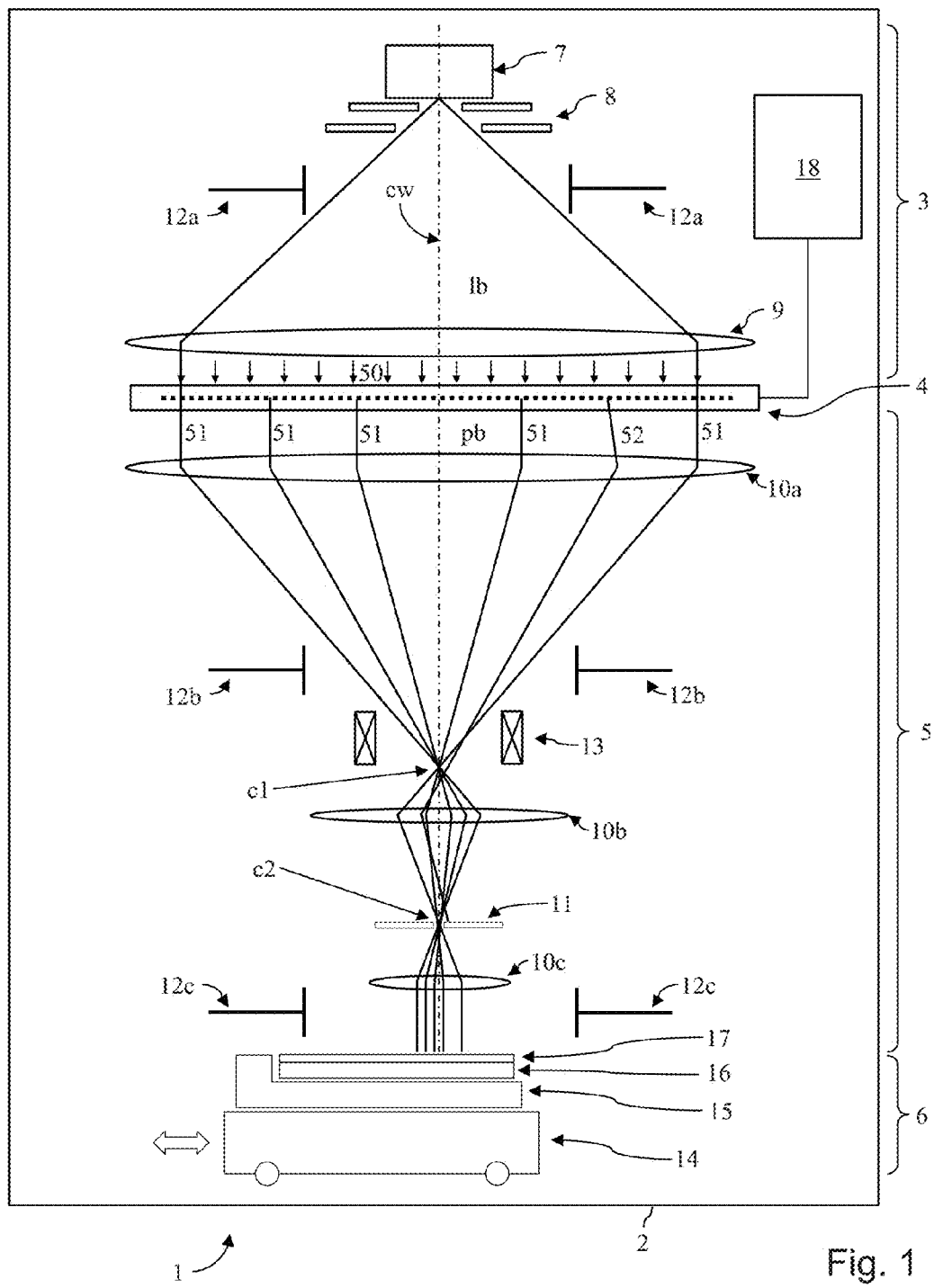
FIG. 1 a charged-particle multi-beam system of state of the art in a longitudinal sectional view.

An overview of a lithographic apparatus as known from prior art employing the preferred embodiment of the invention is shown in FIG. 1. In the following, only those details are given as needed to disclose certain embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cx of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings and/or apertures. The PD system 4 is held at a specific position in the path of the lithography beam lb, which thus irradiates the plurality of apertures and/or openings and is split into a number of beamlets.

Some of the apertures and/or openings are "switched on" or "open" so as to be transparent to the incident beam in the sense that they allow the portion of the beam that is transmitted through it, i.e. the beamlets 51, to reach the target; the other apertures and/or openings are "switched off" or "closed", i.e. the corresponding beamlets 52 cannot reach the target, and thus effectively these apertures and/or openings are non-transparent (opaque) to the beam. Thus, the lithography beam lb is structured into a patterned beam pb, emerging from the PD system 4. The pattern of switched on apertures and/or openings—the only portions of the PD system 4 which are transparent to the lithography beam lb—is chosen according to the pattern to be exposed on the substrate 16 covered with charged-particle sensitive resist 17. The information regarding the pattern to be exposed is supplied to the PD system 4 by the data path realized by means of an electronic pattern information processing system 18; the data path is explained further below in section "Real-time Datapath". It has to be noted that the "switching on/off" of the beamlets usually is realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then, by means of an electro-magneto-optical projection system 5, projected onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a charged-particle sensitive resist layer. The substrate is held by a chuck 15 and positioned by a wafer stage 14 of the target station 6.

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. with 200× reduction. A demagnification of this order is in particular suitable with a lithography setup, in order to alleviate problems of miniaturization in the PD device.

In the whole projection system 5, various provisions are made to extensively compensate the lenses and or deflection means with respect to chromatic and geometric aberrations. As a means to shift the image laterally as a whole, i.e. along a direction perpendicular to the charged-particle optical axis cw, deflection means 12*a*, 12*b* and 12*c* are provided in the condenser 3 and projection system 5. Each deflection means may be realized as, for instance, a multipole electrode system which is either positioned near the source extraction system (12*a*) or the crossovers, as shown in FIG. 1 with the deflection means 12*b*, or after the final lens 10*c* of the respective projector, as in the case with the stage deflection means 12*c* in FIG. 1. In this apparatus, a multipole electrode is used as deflection means both for shifting the image in relation to the stage motion and for correction of the imaging system in conjunction with the alignment system. These deflection means 10*a*, 10*b*, 10*c* are not to be confused with the deflection array means of the PD system 4 in conjunction with the stopping plate 11, as the latter are used to switch selected beamlets of the patterned beam pd "on" or "off", whereas the former only deal with the particle beam as a whole. There is also the possibility to rotate the ensemble of programmable beams using a solenoid 13 providing an axial magnetic field.

Figure 2:
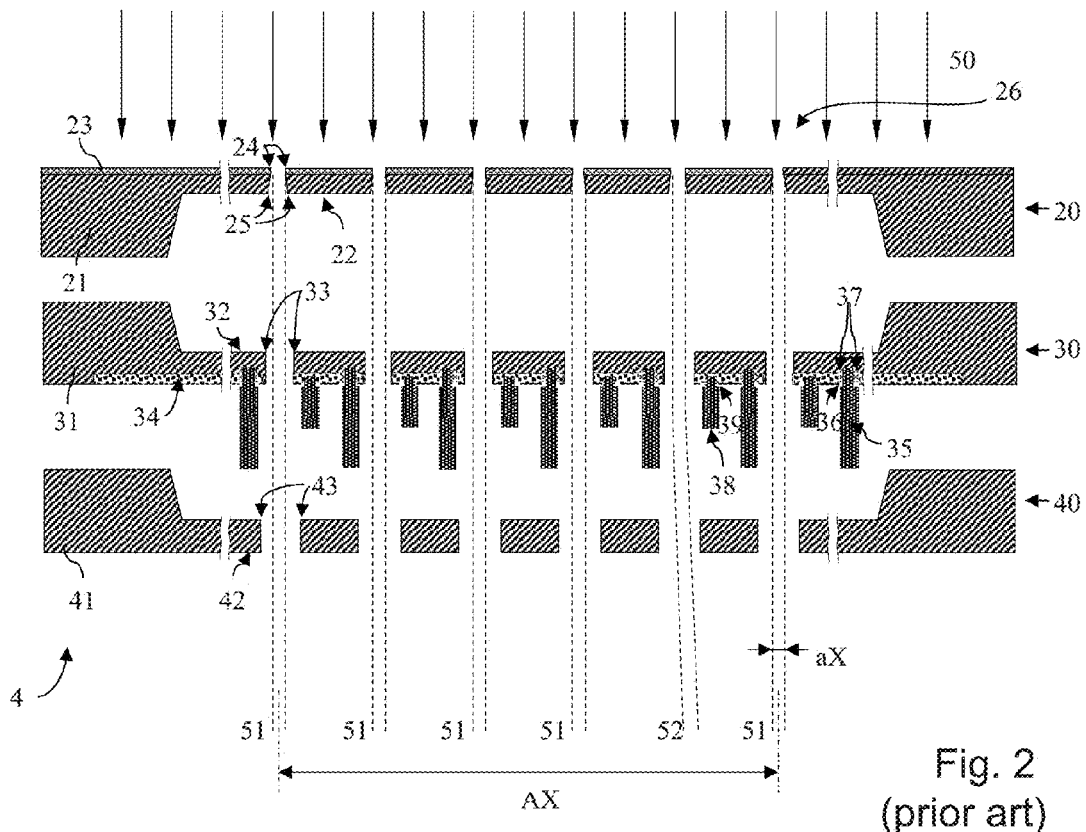
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 11. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be silicon, provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 µm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics and thus provides a defined potential interface to the first lens 10*a* of the projection optics. The thicker part 41 of FAP 40 is a square or rectangular frame made from a part of a silicon wafer, with a thinned center section 42. The FAP 40 is provided with a plurality of openings 43 which correspond to the openings 24 of the AAP 20 and 33 of the DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a beam array field of approx. 82 μm×82 μm at the substrate. These examples are stated for illustrative purpose, but are not to be construed as limiting examples.

Figure 3:
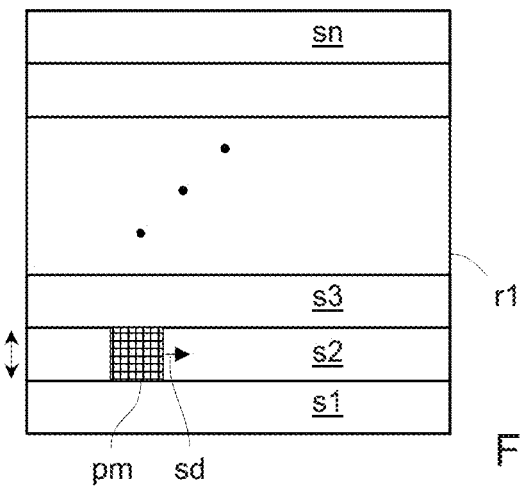
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of certain embodiments of the invention only the relative motion of the pattern image pm on the target is relevant. By virtue of the relative movement the pattern image pm is moved over the area r1 so as to form a sequence of stripes s1, s2, s3, . . . sn (exposure stripes). of width y0. The complete set of stripes covers the total area of the substrate surface. The scanning direction sd may be uniform or may alternate from one stripe to the next.

Figure 5:
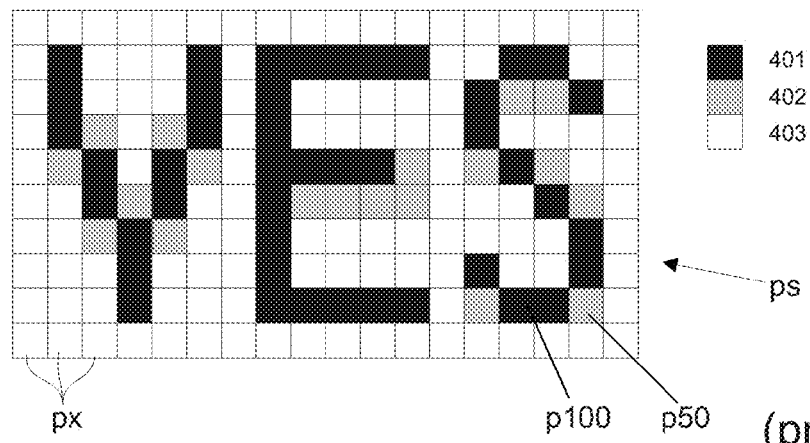
FIG. 5 shows an example of a pixel map of an exemplary pattern to be exposed.

FIG. 5 shows a simple example of an imaged pattern ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic application of certain embodiments of the invention, the number of pixels of the standard image would be much higher. However, in FIG. 5 the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i an integer ("gray index", $0 \le i \le n_y$). Generally, however, the gray values need not be equidistant and form a non-decreasing sequence between 0 and 1.

FIG. 5 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
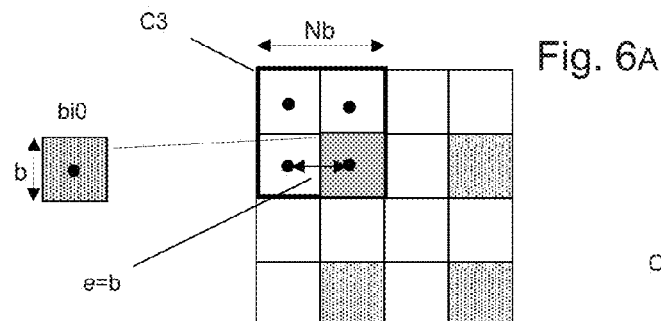
FIG. 6A illustrates an arrangement of apertures with M=2, N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
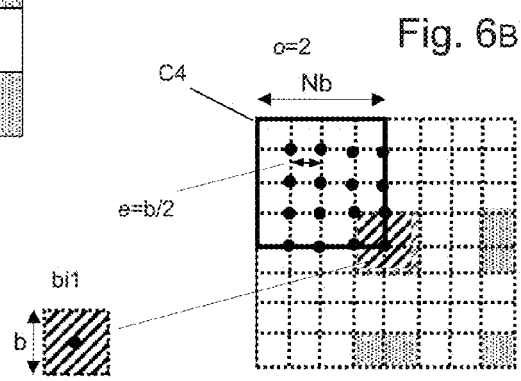
FIG. 6B shows an example of oversampling of the pixels in a "double grid" arrangement.

FIG. 6B illustrates one example of an oversampling of o=2 combined with placement grids, namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8.

Figure 7:
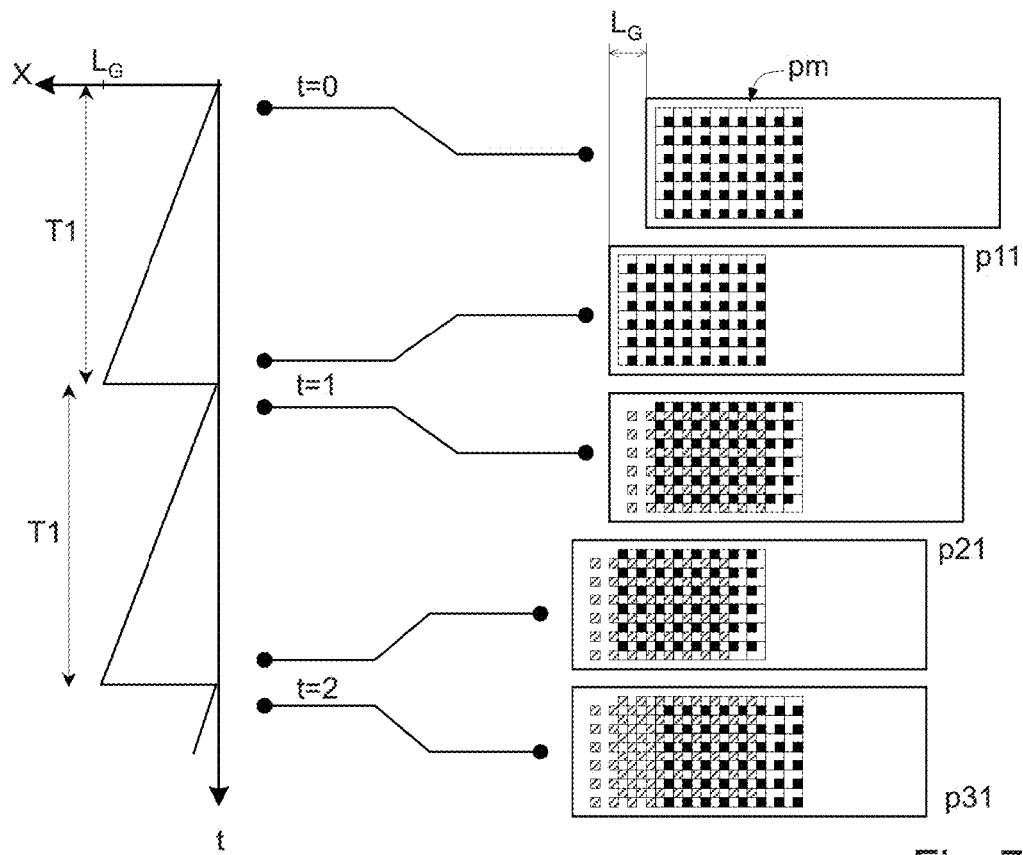
FIG. 7 illustrates the exposure of one stripe.

FIG. 7 shows an exposure scheme of the pixels, which is suitable for certain embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G = vT1 = L/(No)^2 = bM/No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

In prior art it is usually assumed that the dimensions aX, aY of the apertures of the aperture array plate 20, which define the width of the propagating beamlets, are basically identical, and that the intensity of the irradiating beam lb, i.e. its current density, is uniform over the entire aperture field. However, it has been shown that in realistic implementations the doses transmitted to the target varies, mainly as a function of the distance from the optical axis cw. A beamlet located near to the charged-particle optical axis cw will usually transmit a different (higher or lower) dose than a beamlet at the periphery, depending on the higher order changes of the condenser transmission function and the angular brightness distribution of the illumination source. Further, despite the compensation provisions mentioned above, the charged-particle optical components of the lithography apparatus will introduce residual chromatic and geometric aberrations into the lithographic beam lb. Moreover, varying aperture sizes may cause additional contributions to inhomogeneity.

Figure 4:
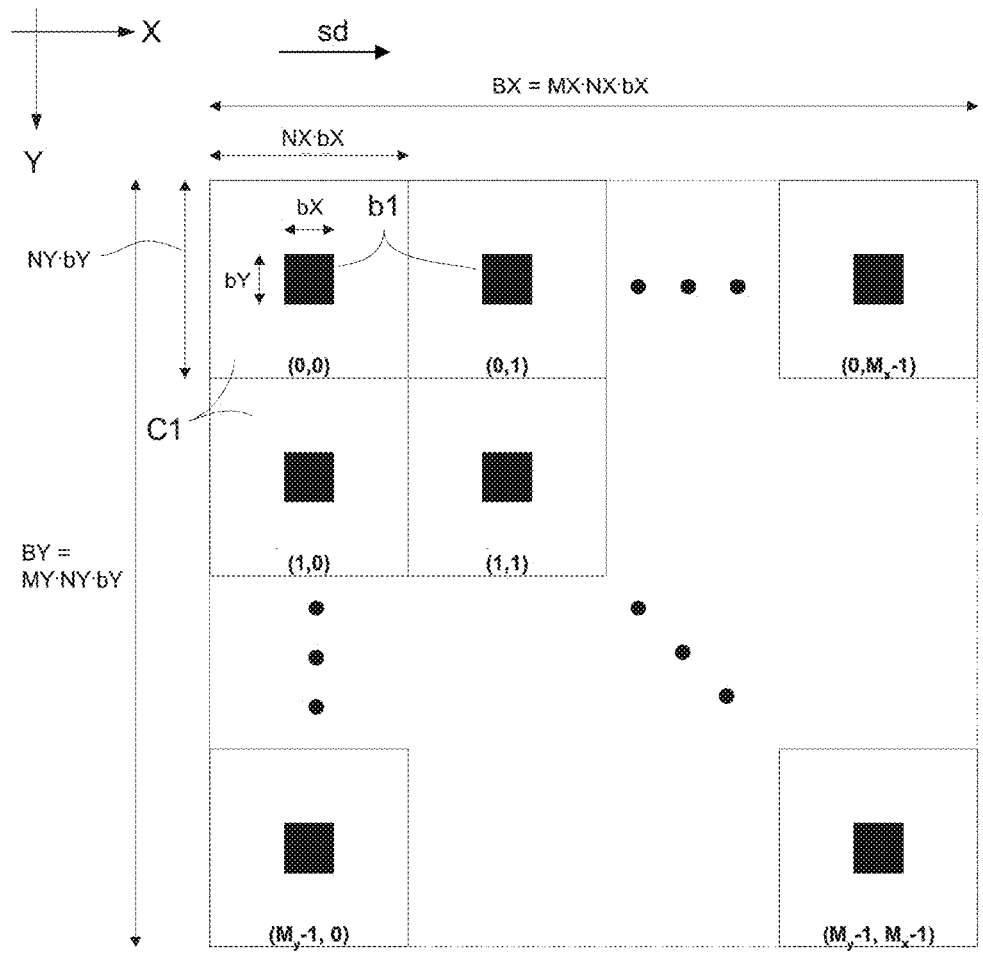
FIG. 4 shows an exemplary arrangement of apertures as imaged onto the target.

To take account of the multitude of irregularities, different approaches may be applied to solve said problems. Two basic approaches are depicted in FIGS. 4 and 5 of U.S. Pat. No. 8,258,488: The widths w1, w2 of the apertures may differ depending on the location on the aperture plate, furthermore, the apertures are located not following a regular grid, but with small deviations configured to compensate for imaging defects. This approach is time consuming and thus expensive since it requires a redesign of the aperture plate; furthermore, it only allows a static compensation of deviations and cannot take into account deviations that are determined immediately before a writing process.

Measuring the Beam Current Distribution

Figure 8:
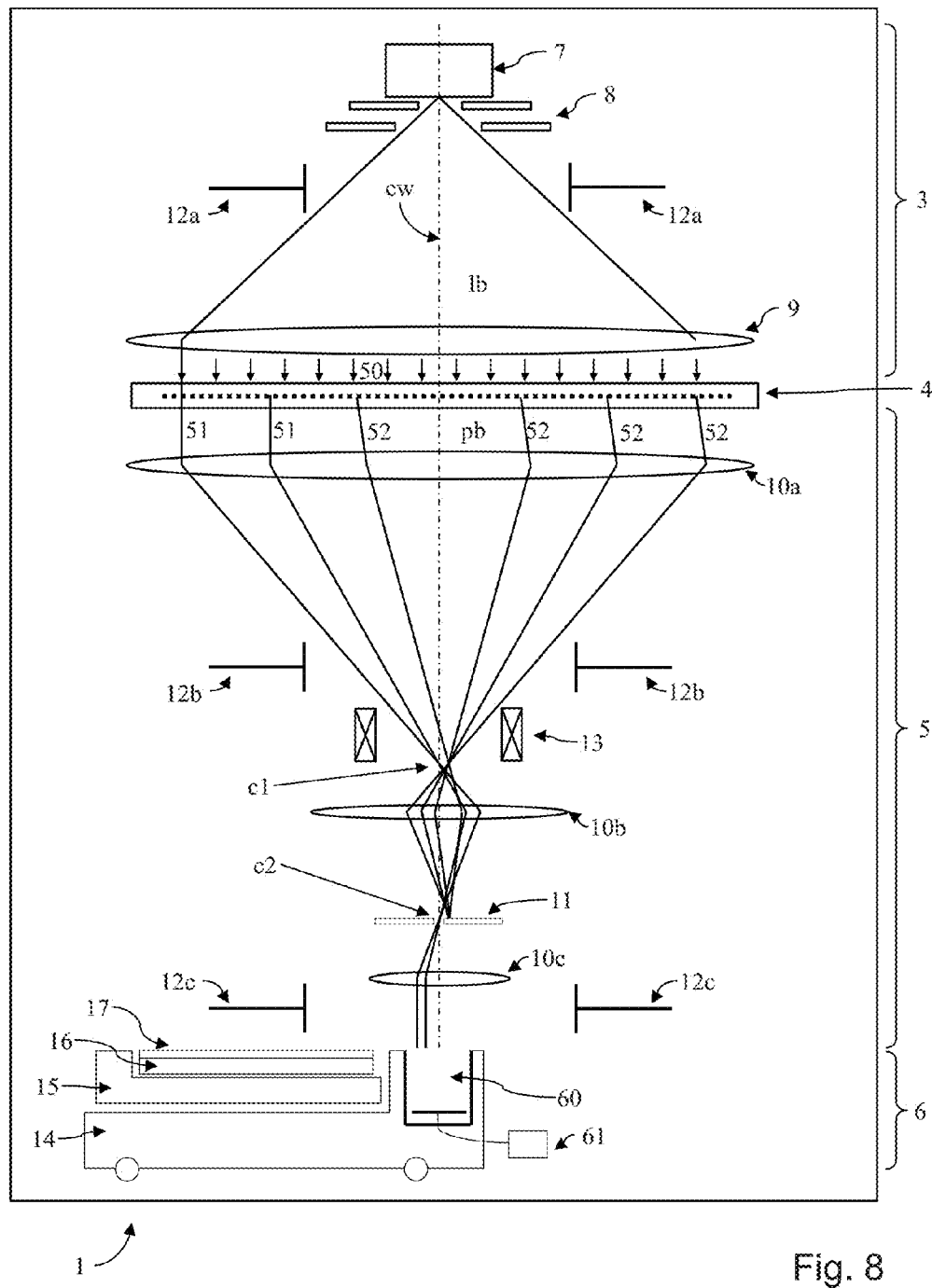
FIG. 8 a charged-particle multi-beam system to which an embodiment of the invention applies in a longitudinal sectional view, showing the current sensor and controller related thereto used to determine the actual current density map as generated by the pattern definition device upon beam projection onto the substrate.

FIG. 8 shows the lithographic apparatus according an first embodiment of the invention in a sectional view comparable to that of FIG. 1. A current sensor 60 is provided for measuring the current distribution within the beam array field, in order to give a current density map as generated by the pattern definition device upon beam projection on to the substrate. The current sensor may be positioned at the end of the column near the substrate plane, substantially at where the target 16 would be placed. In a typical process to measure the current density map, only certain areas of interest in the beam array are switched on, while all other beam parts 52 are switched off. Consequently, only those parts of the beam array reach the current detector and give rise to a certain total current within this area. By this methodology any distribution can be measured. For practical reasons a chess board type of array with 8×8 or 16×16 sub-areas will be convenient. The current density map eventually consists of a number of relative current values that is normalized to, for example, to the area of the maximum current.

The current sensor 60 is, preferably, realized as a Faraday Cup (FC) mounted onto the stage, and connected to an ammeter 61. The stage is shifted to the side for this purpose so that all programmable beamlets of the beam array may enter the FC. By deflecting beams in the PD system and filtering out the beams thus deflected at the stopping plate 11 near the second cross-over c2, it is possible to measure the current of a subset of the beamlets, where the subset can be selected freely. This enables to evaluate the current distribution within the beam array field by programming different subsets of beamlets, without having to move the FC.

Figure 9:
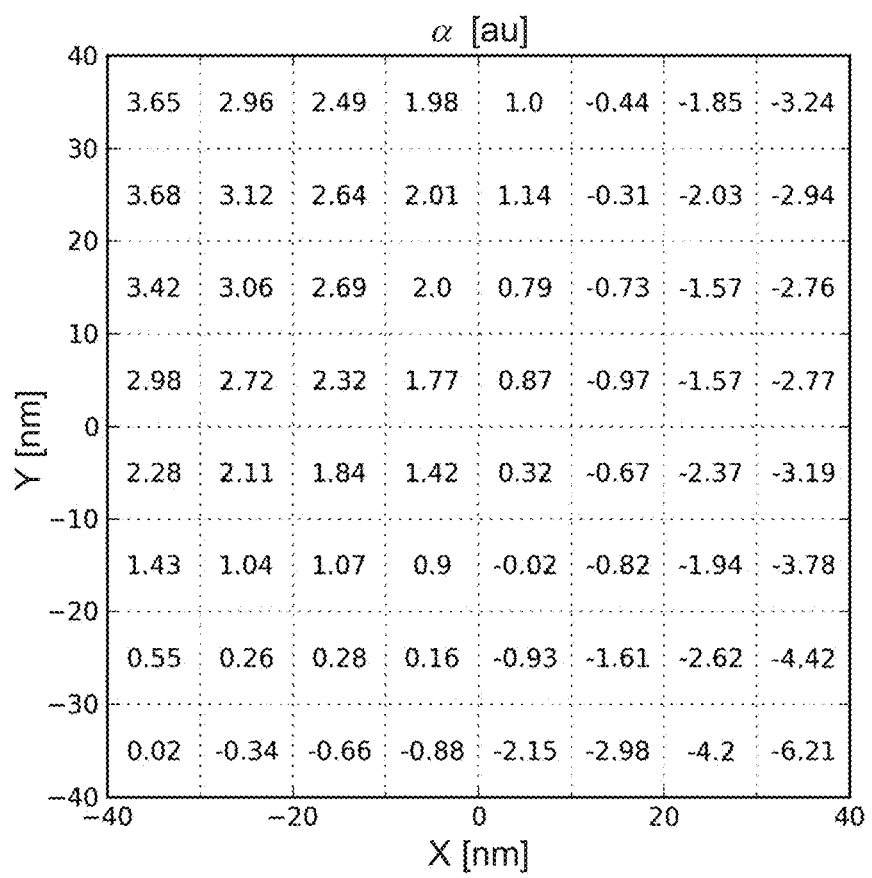
FIG. 9 an example of a measured current density map, expressed as relative deviations in percent from a uniform nominal value, exhibiting an inhomogeneity of the particle source.

FIG. 9 shows a typical example of a current density map Mp (also simply referred to as "map") as measured by means of a setup as shown in FIG. 8. The map was generated by measuring the current of the entire beam array as it falls onto the current sensor, while systematically activating (i.e. switching on) the respectively indicated areas of the beam array, while all other areas are switched off during measurement. Typically, in the map the current dose values near the corners of the beam array are either reduced or enhanced with regard to the average over the map. In the example of FIG. 9 the beam array field of 82 μm×82 μm at the target consisted of 512×512=262,144 programmable beamlets. As shown, a 8×8 matrix of the current dose distribution was measured, wherein each measured value comprises 262,144/64=16,384 beamlets used to generate the respective value. The electron source underlying FIG. 9 was of the type of a thermal field emission cathode with a flat emitter surface (single crystal, e.g. Tungsten or $LaB_6$), where the extraction was done by the extraction system 8. Since the electrons are emitted from a larger surface (typically 20 μm), it is unavoidable due to mechanical imperfection (e.g. alignment of emitter surface with respect to anode) or local differences in the extraction field strength, that the angular current density varies across the emitter.

FIG. 9 shows the results of 64 measurements performed on a 8×8 spatial raster. Evidently, the compensation of dose inhomogeneity will improve when the matrix is finer. However, it was found that, typically, an 8×8 or 16×16 will be sufficient to provide satisfactory compensation of the dose inhomogeneity. Ideally, the grid may be chosen so as to be as fine as the beam array, e.g. every beam having its individual current dose correction; however, this would cause significant extra computing power.

Real-Time Datapath

The complete pattern image comprises a vast amount of image data, which is why for efficient computation of those data a high-speed datapath that generates the pixel data to be exposed, preferably in real-time, will be suitable. However, the pattern to be exposed is typically described in a vector format, e.g. as a collection of geometries like rectangles, trapezoids or general polygons, which typically offers better data compaction and therefore reduces the requirements on data storage. The datapath therefore consists of three major parts:

1) a vector-based physical correction process,
2) a rasterization process to translate the vector to pixel data, and
3) a buffer to temporarily store the pixel data for the writing process.

Figure 10:
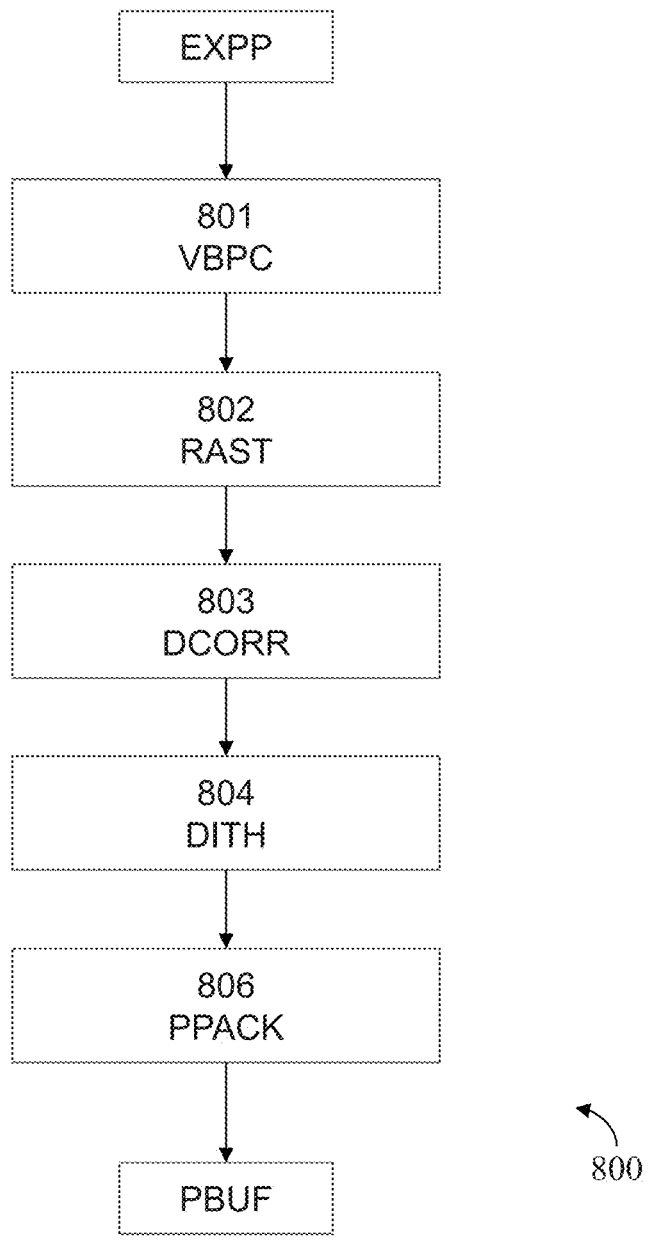
FIG. 10 a flow diagram illustrating the data preparation flow with dose distribution corrector of an embodiment of the invention.

FIG. 10 shows a flowchart of the datapath 800. The datapath starts upon being supplied a pattern EXPP to be exposed.

Stage 801: Vector-based physical corrections (VBPC). The pattern to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries. The chunks are sent to the Rasterization process independently.

Stage 802: Rasterization (RAST). The geometries of every chunk are converted to a raster graphics array, where the pixel gray level represents the physical dose of the corresponding aperture image. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers; only later they are converted to the discrete set of dose values as supported by the PD device. As a result of rasterization the pixel data will be in the format of floating point numbers representing nominal dose values y for the respective pixels.

Stage 803: On-line Dose Corrector (DCORR). The floating point dose values y are modified by help of the measured current density maps (or dose correction maps), whereas simple mathematical operations are applied such as multiplication of individual nominal dose values of the pixels with the relative correction factors. This is based on the fact that every pixel is associated with a specific beamlet of the exposure apparatus, and thus to a certain aperture of the PD device. Therefore, it is possible to apply the correction value of the respective beamlet or beam area within the current density map to the nominal dose values, using the correction values determined experimentally prior to correction. This step will yield a set of modified floating-point data y', which represent the compensated exposure dose values for each beamlet in (the respective region of) the intended pattern.

Stage 804: Dithering (DITH). The dithering process 805 converts the dose value data y' into gray value data, based on a predetermined gray value scale. This is a position-dependent rounding process that ensures that rounding errors are averaged over nearby pixels which, combined with oversampling, allows for a much finer dose variation than with the discrete set of dose values available for a single aperture (see section "Illustration of the Compensation Method"). This conversion can be realized by means of known algorithms for the conversion of visual image data into pixel graphics. Such algorithms may be, for instance: using simple arithmetic rounding or other ordered methods; parameterized stochastic methods; as well as generic stochastic methods; such methods are well-known from prior art and may also allow to distribute errors arising from the quantization over a number of neighboring pixels by a predetermined rule.

It is possible to apply additional corrections at this stage, provided they can be applied in the pixel domain, immediately before or after dithering depending on the actual correction (e.g. defective apertures correction).

Stage 805: Pixel packaging (PPACK). The pixel image obtained from stage 804 is sorted according to the placement grid sequence and sent to the pixel buffer PBUF. The pixel data is buffered until a sufficient amount of data, typically at least the length of a stripe, is present which triggers the exposure of the stripe. The data is taken out of the buffer during the writing process. After the stripe has been written, the process described above starts anew for the pattern data of the next region, such as the next stripe.

Compensating Deviations in the Beam Current Doses

In the following, specific implementations of the compensation method according to certain embodiments of the invention are discussed. The inhomogeneity of the illumination system leads to a variation of the beamlet current dose D(r), which is a function of the position r on the PD system of the aperture that is associated with the beamlet. In the ideal case, the beamlet dose would be constant over the entire apperture array, i.e. a constant nominal value c which is equal to the maximal gray level. In realistic applications, the beamlet dose shows a small, spatially varying deviation from this value c. This allows to define the deviation function α(r) as the relative deviation from the normative dose on the target over the range of all aperture images generated on the target.

The entries of the coarse-grained current density map, like the one shown in FIG. 9, are denoted as $d_i$. These values are used to assign a maximum dose $D_i = D(r_i)$ to each aperture at $r = r_i$ on the grid of MX×MY aperture grid positions b1 (cf. FIG. 4), for instance by assigning directly the value $D_i = d_i$ to each aperture within each area, or an interpolated value determined from the array of $d_i$ data (for example, linear interpolation from points of support respectively having the values of the map and being located at the center positions of each area of the map Mp). Then, the relative deviation α(r) is defined as $$\alpha(r_i) = \frac{D_i - c}{c} = \frac{D_i}{c} - 1, \quad (1)$$

where c is the nominal dose value. The nominal dose value may be a predetermined value, or it may be chosen based on experimental data, such as the mean value of all measurements, $$c = \frac{1}{N}\sum_{i=1}^{N} D_i,$$

or the average of the minimum and maximum occurring dose, $c = (\max(D_i) + \min(D_i))/2$, or the minimum dose, $c = \min(D_i)$ (which avoids truncation by the min function in Eq. (2)).

Suppose that a beamlet k, originating on the PD system at position $r_k$, is expected to deliver a nominal dose y (by reducing the duration of unblanked exposure—full exposure would lead to the nominal dose c), where y is in the range between 0 and c. Because of the spatial inhomogeneity of the beam current distribution, the beamlet will actually generate a dose $y_{phys} = y \cdot (1 + \alpha(r))$. The compensation according to many embodiments of the invention uses the following basic approach: Rather than y, we assign a modified dose y' to the beamlet:

$$y' = \min(D_k, y/(1 + \alpha(r_k))) \quad (2)$$

It follows for $y' < D_k$ that $$y'_{phys} = y' (1 + \alpha(r)) = y. \quad (3)$$

The y' values thus obtained are then further processed into gray values using a suitable dithering method as described in the section "Real-time Datapath".

In other words, the nominal dose y is divided by a compensation factor $q = 1 + \alpha(r)$ (provided that the resulting number y' is smaller or equal to the maximum beamlet dose $D_k$), which is based on the error of the current dose distribution. If arbitrary (i.e., floating-point) values of y were available for the final writing process, this would enable to cancel the error exactly. However, due to the limitation of the writing process to a given discrete scale of gray values, there will be a residual error corresponding to a "rounding error" which arises because for the actual writing process the compensated dose values y' are converted to respective values out of the gray scale. For instance, with a 4 bit gray scale (assuming o=1), 16 different values are available (in steps of $1/15 = 6.6\%$). Thus, a residual error will remain. Whenever the relative error α(r) is smaller than the rounding error, a compensation is not possible with the algorithm presented; e.g. an error of 3% can not be compensated in a meaningful way if the available dose steps are 6.6%.

Many embodiments of the invention also allow to compensate for deviations that vary as a function of time. For instance, it is possible to catch variations of the source by performing the measurement using the current detector at regular time intervals, for instance before each writing process or at the start of a shift. Also a time-variation f(t) during a writing process may be compensated, provided such time-variation is known from theoretical considerations and/or experimental data. Also it is possible to take account of time-dependent processes such as ageing of a resist. If the variation of resist sensitivity is known as a function of time, f(t), this function may be used as an additional correction factor entering the compensation factor, i.e., $q = (1 - \alpha(r)) \cdot f(t)$. The same approach is possible for taking into account time-dependent variations of the overall intensity of the particle source.

Illustration of the Compensation Method

Figure 11:
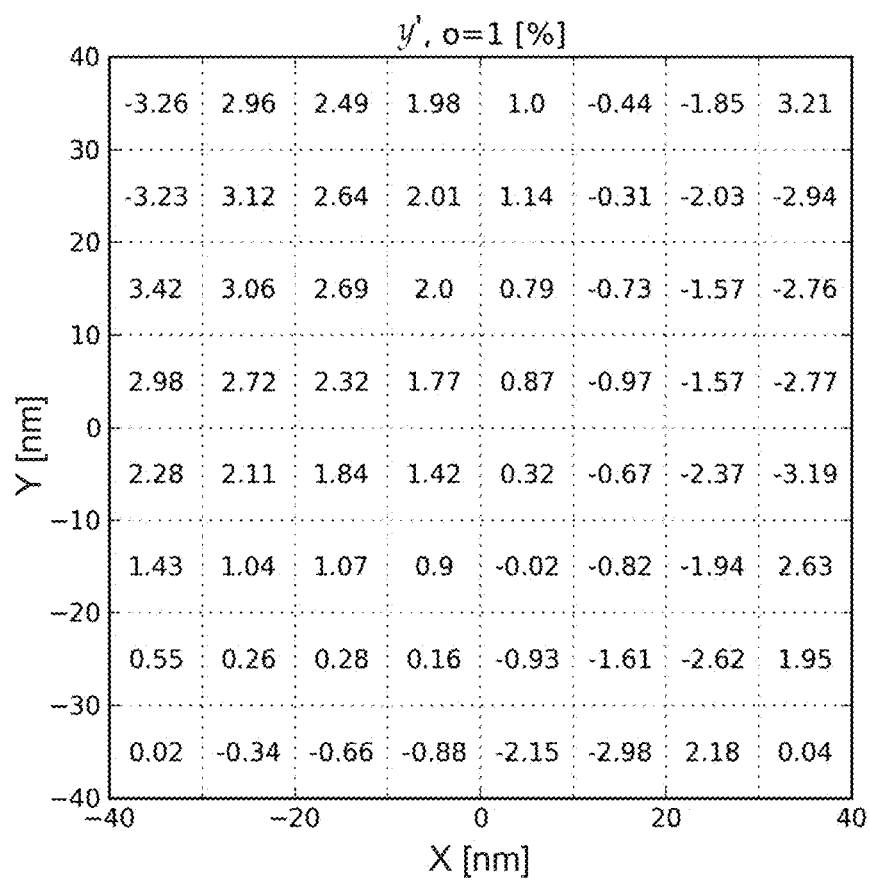
FIG. 11 a map of the relative dose rate error after compensation obtained from the map of FIG. 9 using non-overlapping exposure spots.
Figure 12:
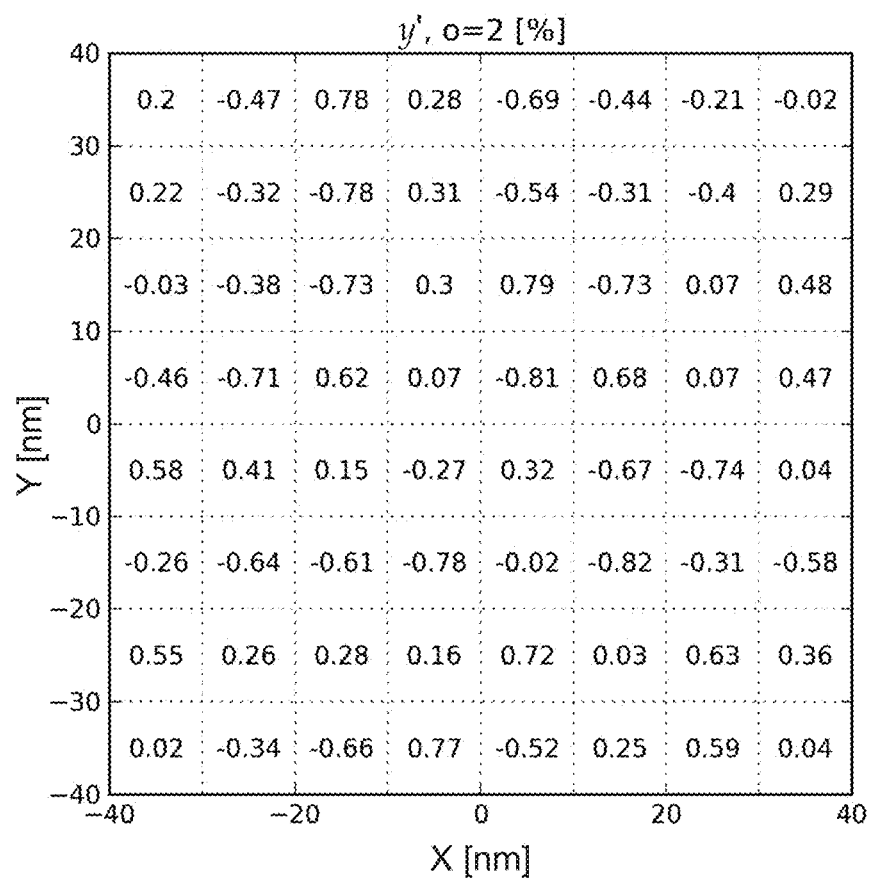
FIG. 12 a map of the relative dose rate error after compensation obtained from the map of FIG. 9 using overlapping exposure spots with an oversampling factor of o=2.
Figure 13:
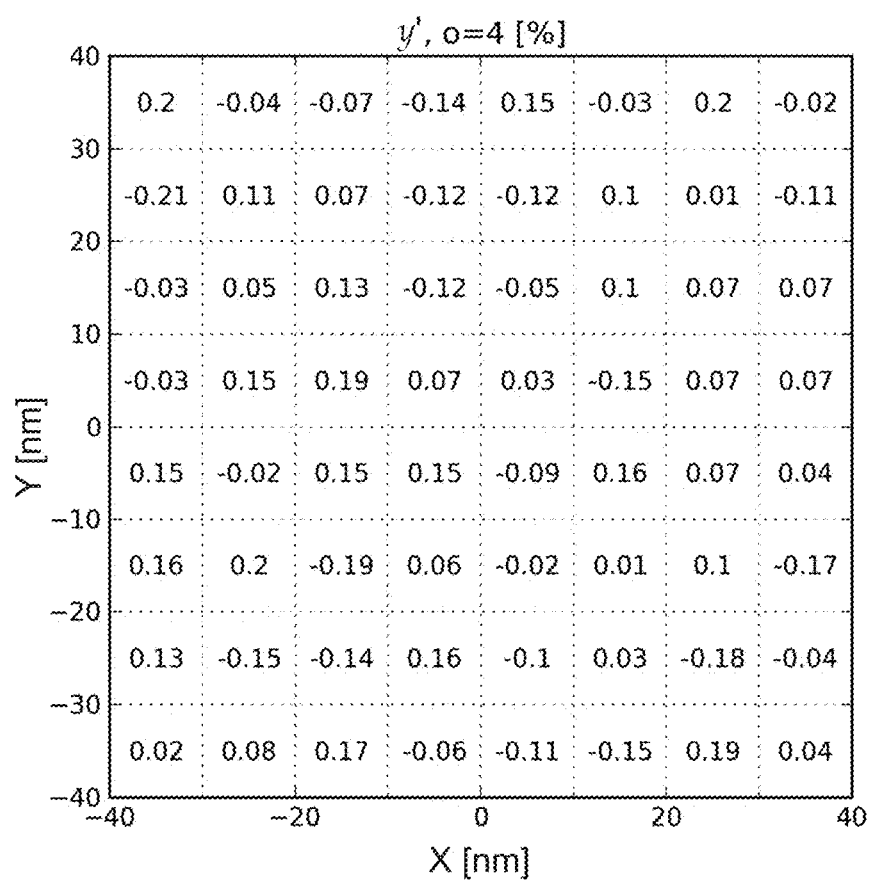
FIG. 13 a map of the relative dose rate error after compensation obtained from the map of FIG. 9 using overlapping exposure spots with an oversampling factor of o=4.

Referring to FIGS. 11-13, this section presents a simple model to illustrate the role of oversampling on the dose inhomogeneity correction as described in the previous section.

The model is based on the (simplifying) assumption that the aperture image of a beamlet is a dose distribution on the target which is nonzero only in a square region (e.g. bi1, see FIG. 6B) with a side length of b, where it has an evenly distributed dose (a 2D rectangular function, centered at a point of the placement grid); furthermore, each aperture image overlaps with neighboring aperture images so that the distance between the centers of neighboring aperture images is e=b/o. It follows that each image element (the square area within four neighboring placement grid points) is exposed by $o^2$ aperture images, and the total dose applied on the image element is the sum of the doses associated with the gray values of the aperture images which contribute to image element in question. This will increase the number of possible total doses by a factor of $o^2$. For instance, when starting from a gray scale with $n_Y = 2^G$ equidistant gray values (namely 0, $1/(n_Y-1)$, ..., $y/(n_Y-1)$, ..., 1, i.e. $(n_Y-1)$ increments), the total dose applied on the image element has one of $(n_Y-1) \cdot o^2 + 1$ values (called "effective gray levels" in the following), lowering the relative dose increment to $1/(n_Y-1) \cdot o^2$. Concurrently, each aperture image contributes to $o^2$ image elements at the same time, which makes it possible to adjust the total dose applied on an image element in $(n_Y-1) \cdot o^2 + 1$ steps, but not independently for every image element.

Using the effective gray levels, corrections beyond the abovementioned 6.6% (dose increment relative to the maximum dose applied on an image element) are possible. The relative dose increments $w_0$ for $n_Y = 16$ are $w_1 = 1/(15 \cdot 1^2) = 6.66\%$ for o=1, $w_2 = 1/(15 \cdot 2^2) = 1/60 = 1.66\%$ for o=2 and $w_4 = 1/(15 \cdot 4^2) = 1/240 = 0.4166\%$ for o=4.

In the following, we use a realistic, experimentally measured dose map α(r) (deviations from a constant nominal value c, measured on an 8×8 grid), as depicted in FIG. 9. We assume that an image element is written by $o^2$ aperture images which have an identical relative deviation α (e.g. the corresponding beamlets come from the same section of the PD, or they are written by a single beamlet), from which it follows that the image element has the same relative error α as the beamlets, and the error compensation can be illustrated (see FIGS. 11-13) on the basis of beamlets/apertures instead of the more complex image elements. Then, after applying the correction (2) on the nominal dose y, the corrected dose y' is rounded to the next effective gray level, with a maximum rounding error of $w_0/2$ (i.e. $w_1/2=3.33\%$, $w_2/2=0.833\%$ and $w_4/2=0.20833\%$).

FIGS. 11-13 show the relative dose rate error after compensation for respective regions of the PD (which are directly related to the image elements in this model, as outlined above), for a dose y=c (i.e. the nominal maximum dose) and o=1, o=2 and o=4, respectively. (For the sake of simplicity, it is assumed that the corrected dose $y<D_k$, i.e. the corrected dose is not higher than the maximum dose of the aperture.) The figures demonstrate the efficient compensation by virtue of the method in accordance with a number of embodiments of the invention, and also the gradual improvement of the compensation with increasing oversampling factor o. The calculation of the data shown in the plots is illustrated in the following for the top left deviation measurement α=0.02963. The corrected dose (Eq. 2) is $y'=y/(1+\alpha)=c/(1+0.02963)=0.9712 \cdot c$. Then, y' is rounded to the nearest possible gray level $y'_Y=\text{Round}(y/c \cdot u) \cdot c/u$, where $u=(n_Y-1) \cdot o^2$ (u=15 for o=1, u=60 for o=2, u=240 for o=4), and Round( ) is a rounding function from real argument to an integer result, such as rounding to the next integer. In particular, this results in $y'_Y=1 \cdot c$ for o=1, $y'_Y=0.966 \cdot c$ for o=2 and $y'_Y=0.9708 \cdot c$ for o=4, leading to a physical dose (Eq. 3) of $y'_{Y,phys}=y'_Y(1+\alpha)=1.03 \cdot c$ for o=1, $y'_{Y,phys}=0.995 \cdot c$ for o=2 and $y'_{Y,phys}=0.9996 \cdot c$ for o=4. The errors shown in FIGS. 11-13 are the relative deviations from c, which are, for the described case, 2.96% (identical to the original error) for o=1, −0.47% for o=2 and −0.04% for o=4.

The accuracy (i.e. error width) of the contour line positioning of the desired pattern is directly related to the rounding error. The contour position within an image element is linearly dependent on the dose of the aperture images that apply dose on the image element. Only the aperture images directly at the pattern edge are used to define the contour line position (with a maximum variation of e, meaning that the contour line is shifted from the left to the right edge of the image element—see FIG. 6B), and it follows that there are $(n_Y-1) \cdot o$ effective gray levels for the positioning of contour lines (analogous to the $(n_Y-1) \cdot o^2$ effective gray levels for the total dose of an image element) in the range of e. The contour line position accuracy is $e/((n_Y-1) \cdot o)=b/((n_Y-1) \cdot o^2)$, which is 1.3 nm for o=1, 0.3 nm for o=2 and 0.083 nm for o=4.

Considering a typical feature of interest like a simple line structure, the error of the dose value can, in adverse but not unlikely cases, cause the opposite line edges to shift in opposite directions. Line width errors impact the so-called CD uniformity and have to be as low as possible. Consequently, corrections using solely the gray level of the individual beamlets (i.e. o=1) would suffer from insufficient accuracy if the discrete gray level increments are too large. On the other hand, the required data rate of the multi-beam writer increases with the number of gray levels. It is therefore required to work around the limitation of discrete dose levels for the intended dose inhomogeneity correction in order to meet industry requirements (e.g. 1.2 nm CD variation, 6 sigma).

Stochastic Rounding of Dose Values

As another method for rounding of the dose value to integer (discrete) dose values, parameterized or generic stochastic methods may be used. This may be alternative or supplemental to arithmetic rounding as discussed above. As one example, a stochastic method based on a probability distribution P(x) is described; other implementations will be evident to the skilled person. In such a case, y' is determined as the nearest possible gray level $y'_Y=\text{Trunc}(y')+\text{Round}(P(y'))$, where P(x) is a probability distribution on the interval (0,1] with an expectation value corresponding to the fractional part, for instance 0.5. Hence, one may define a stochastic rounding function $SR(x)=\text{Trunc}(x)+\text{Round}(P(x))$. Note that if y' is equal to a discrete dose level already, the application of the stochastic probability distribution may be skipped.

The functions P(x) and SR(x) may, in general, be any suitable distribution function provided it meets the required values of mean and deviation. For instance, P(x) and SR(x) may be Gaussian distributions with mean of 0.5 and standard deviation of 0.1. Thus, gray levels at the nearest lower and nearest upper gray level will be chosen, but the outcome is not (pre)determined for a single realization. For a given y' the mean of the realizations will "on average" correspond to y'. Such a non-deterministic behaviour can contribute to the reduction of systematic rounding errors. On the other hand, noise is introduced (in the example of the Gaussian, noise is of the order of the standard deviation). In the context of a number of embodiments of the invention, i.e., multi-beam lithography, this noise in discrete dose values will also translate into (small) variations of edge placement of the printed structures and introduce high-frequency noise. However, this will not be detrimental since random ("white") noise with small amplitudes will generally not be limiting to printing quality, whereas systematic feature variations usually have larger, disadvantageous effects, which may force rejection of the written mask, and are easily detected by inspection tools.

Demonstration of the Beam Current Dose Compensation

Figure 14:
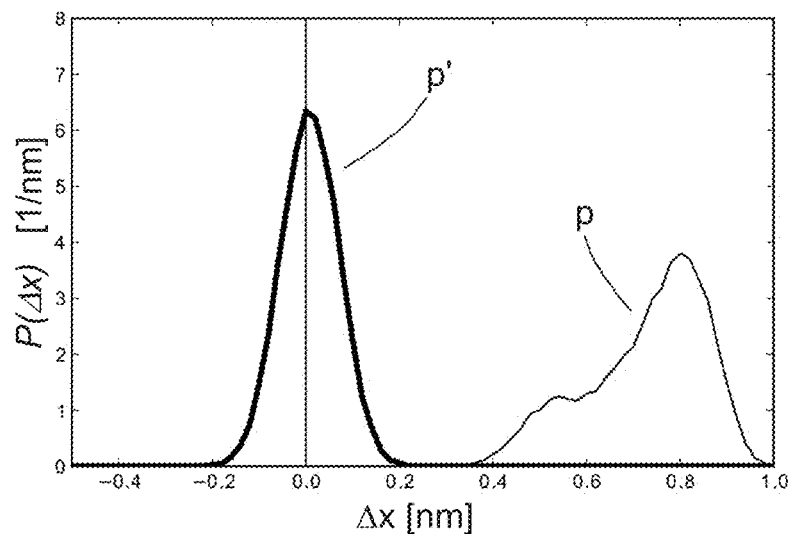
FIG. 14 a simulated positioning error distribution for the map of FIG. 9 with the minimum current dose is the nominal current dose.
Figure 15A:
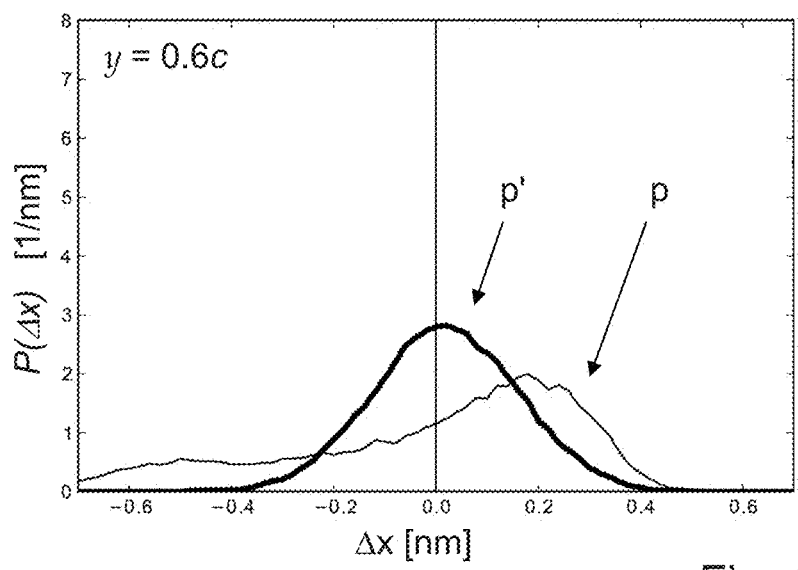
FIG. 15A to 15D four simulated positioning error distributions for the map of FIG. 9 for different pattern doses of y=0.6, 0.7, 0.8, and 0.9, respectively, with the average current dose as the nominal current dose.
Figure 15B:
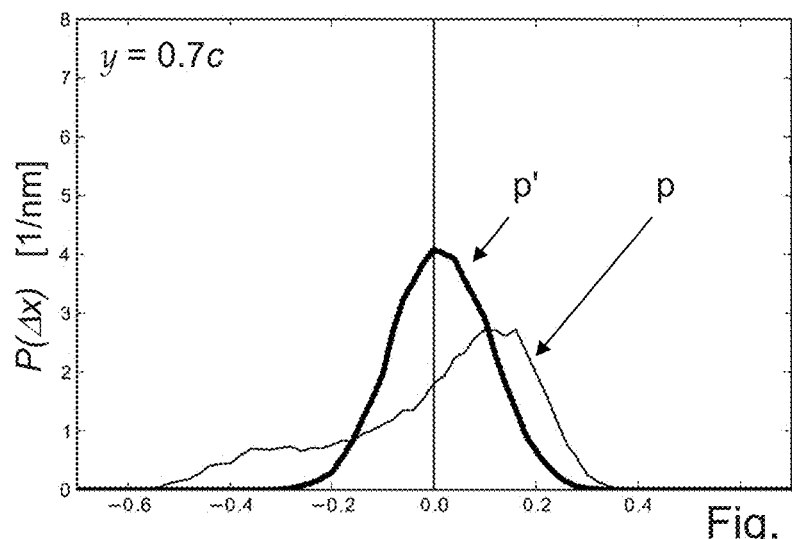
Figure 15C:
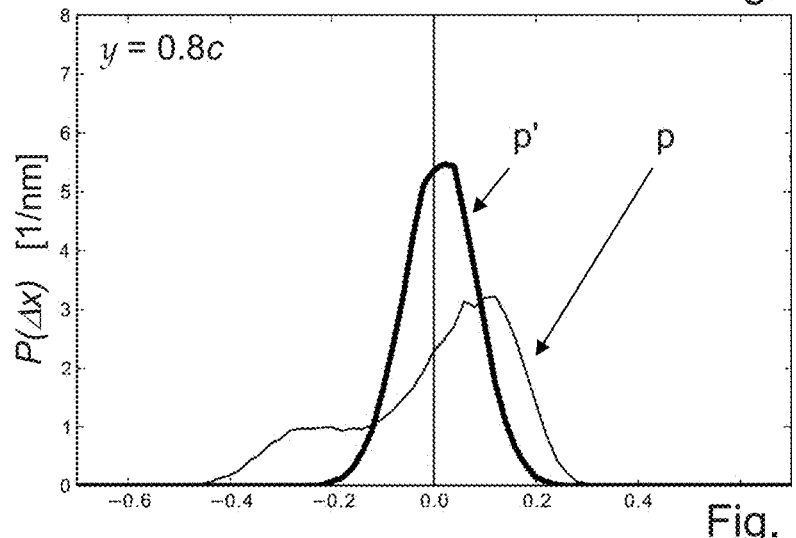
Figure 15D:
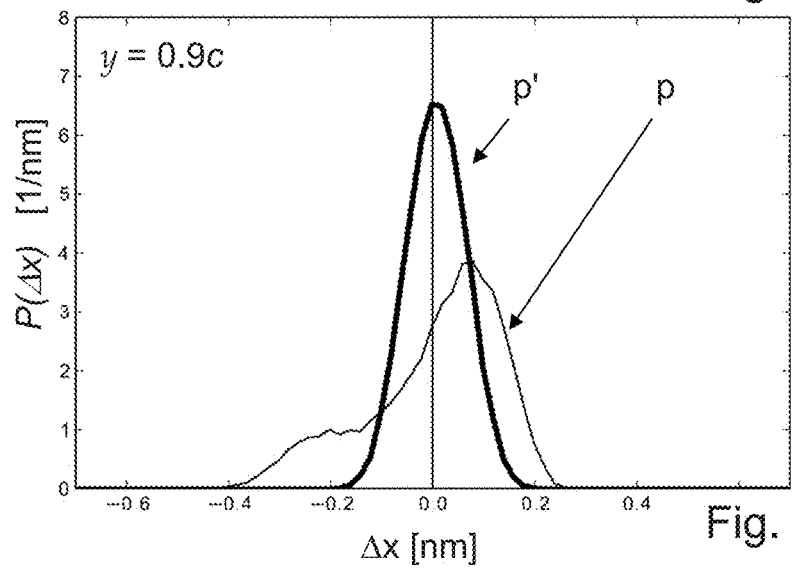

FIG. 14 shows simulation results of the method as outlined in section "Compensating Deviations in the Beam Current Doses". The positions of contour lines of the desired pattern in a simulation lacking the correction method are compared with the positions in a simulation including the correction method, using the realistic current density map as shown in FIG. 9 and the choice of c at the minimum dose; shown is the distribution p(Δx) of the positioning error Δx. The simulation was based on test patterns of rectangular shape, having a dose y=0.9 c. For the uncorrected scenario p (finer line), the line edge variation is approx. 0.5 nm wide; in addition, the center of the variation is off target by approx. 0.8 nm, which is a consequence of the choice of c at the minimum dose. The compensation according to several embodiments of the invention results in a the scenario p' (thicker line) having a variation which is typically approx. 0.1 nm wide (1 sigma), and the center of the variation is virtually at target position. This demonstrates the improved positioning accuracy provided by the compensation of certain embodiments of the invention.

The statistics only include contour lines to the respective right of each desired pattern; i.e. for a rectangular pattern, the contour line corresponding to the right border of the rectangle was considered. The statistics for top, bottom and left contour lines are equal, except for exchanging the Δx with Δy (top, bottom) and mirroring the distribution w.r.t. the origin (left, bottom). The contour line is at 0.5 c.

FIGS. 15A to 15D show results of analogous simulations, but with a variation of the desired dose y of the test pattern (y=0.6·c in FIG. 15A, y=0.7·c in FIG. 15B, y=0.8·c in FIG. 15C, y=0.9·c in FIG. 15D) and a choice of c at the average dose. As visible in the plots, the accuracy before and after the correction depends on the dose y of the pattern: A higher dose leads to a higher slope at the contour line of the pattern, which decreases the propagation of error, i.e. decreases the dependency of the contour line position on dose variations (in this case, the dose inhomogeneity).

From the above it will be clear that the compensation method of many embodiments of the invention offers an efficient way to compensate the undesired effect of deviations of the beam intensity from an idealized uniform distribution over the range of all beamlets. Furthermore, taking oversampling (i.e. overlap of aperture images) into account, it is possible to compensate dose variations significantly smaller than the dose increment between gray levels.

Compensation by Row Calibration

Figure 16:
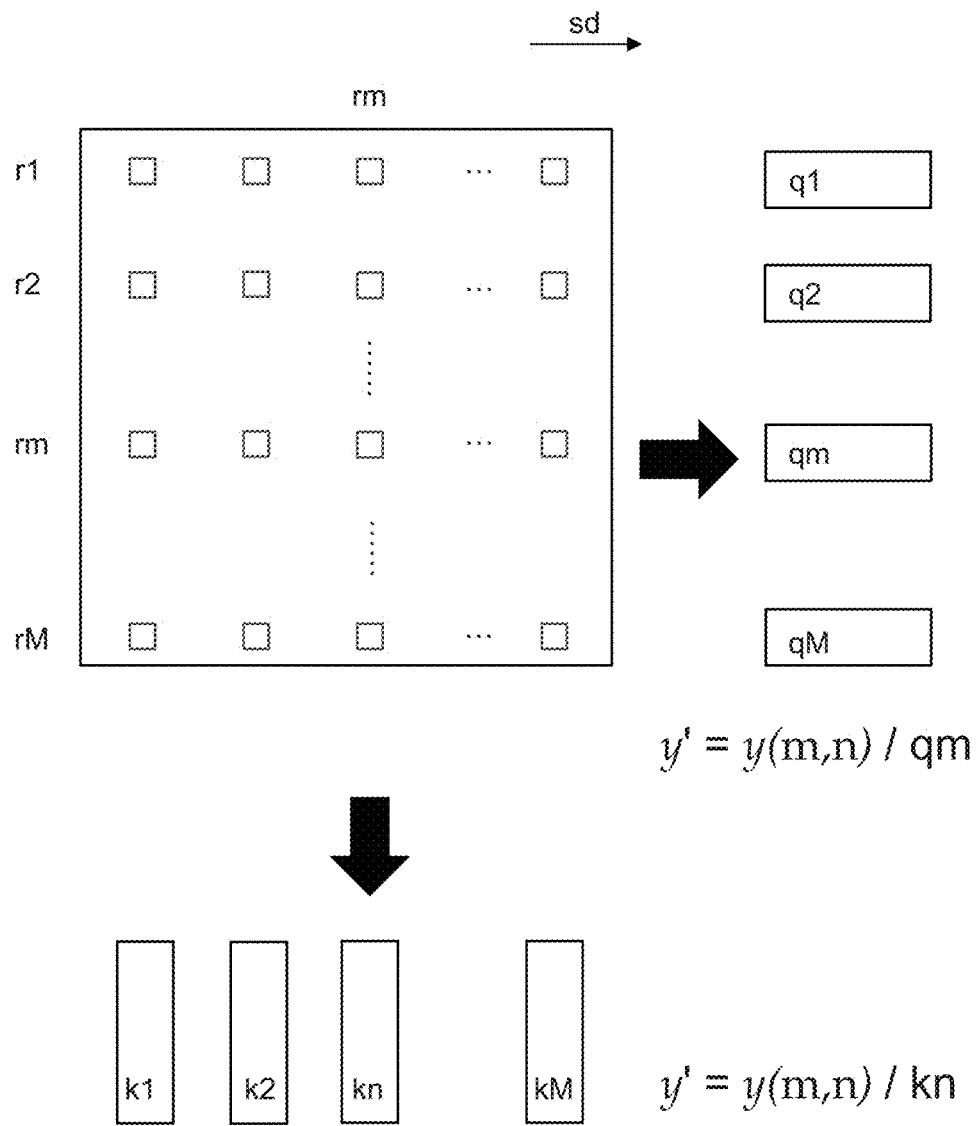
FIG. 16 illustrates further variants of embodiments of the invention relating to a row calibration and a column calibration.

Referring to FIG. 16, a further advantageous embodiment of the invention provides for an improvement of the LCDU (local line width uniformity). LCDU is one of the special requirements for pattern writing, and one of the most demanding requirement in industry nowadays. For example, for lines a LCDU of smaller that 0.2 nm 1 sigma is required. This is particularly challenging for features where beamlets out of a larger area of the pattern definition means contribute. Very small dose errors play a role especially for lines that are patterned by one row of beamlets along the scanning direction. With typically 0.25 nm CD change per 1% dose change, the stringent LCDU requirement for lines along aperture rows require a dose control much better than 1% of the integral dose per row. In order to ensure this accuracy the compensation method described above is modified by introducing an additional "row calibration factor" where for each row rm of apertures (here, m is the index of the row, m=1, ... M) the dose of every aperture (beamlet) along each entire row is calibrated with the same factor q1, ..., qm, ..., qM. In other words, the dose value y of an aperture image generated by an aperture at m-th row and n-th column within the aperture array is divided by the pertinent row calibration factor, y'=y/qm.

The row calibration factors are introduced to improve CD control, by compensating variations of integral doses as generated by a certain row of beamlets. One method to determine the row calibration factors is analogous to the method as described above for FIG. 9, by switching on one row of beamlets and measuring the current with a current detector such as the detector 60 of FIG. 8. This will give an overall current value Q1, Q2, ..., Qm, ..., QM for each of the rows r1, ..., rm, ..., rM. The row calibration factors are calculated by relating these values Q1 ... QM to a common reference value $Q_0$, e.g. the mean value of the set Q1 ... QM, or the maximum or minimum value thereof, i.e., qm=Qm/$Q_0$.

An alternative, possibly more accurate, methodology to determine the row calibration factors is scanning the beam array along those rows of beamlets (apertures) for which the row calibration factor shall be determined, and use the blanking device to pattern line structures where only one aperture row contributes to each respective line. If N is the number of rows, at least N line patterns have to be patterned to define all row calibration factors. In order to experimentally determine the CD a high precision metrology (CD-SEM) may be used to measure the line width (CD) of all N lines.

Preferably, both a two-dimensional dose compensation algorithm, using a dose map as shown in FIG. 9, and a row calibration algorithm may be used, where the experimental determination of the row calibration factors (as described in the previous paragraph) is already using the dose compensation. This way, the line structures are generated with the dose corrected beam array, and the row calibration factors then remove residual errors impacting the CD performance.

In an analogous approach it is possible to introduce column calibration factors, where for each column of apertures the dose values of all apertures (beamlets) in the respective column are scaled using a respective column calibration factor k1, ... kn, ..., kM (here, n is the index of the column). The column calibration factors may be normalized to the average dose (or the maximum or the minimum dose) of the columns. The methodology to determine the column calibration factors is analog to the row calibration factors, either by current measurement whereas individual columns are turned on and off, or by patterning with metrology on lines that are parallel to the columns (the beam array is then, exceptionally, scanned along the direction of the columns for this calibration purpose).

One major advantage of the row and column dose calibration is that it combines high efficiency with a small invest of calculation time: As already mentioned, a typical beam array has a considerably number of individual beams, for instance 512×512=262,144. Instead of correcting all beamlets individually, as an approach to considerably reduce the expense of data handling and computational effort, only 512 row calibration factors qm may be used in addition to the 8×8 or 16×16 measurements of the current density map to significantly improve the CD and LCDU performance of the writer apparatus. In contrast to the current density map, the row calibration factors may vary significantly between rows, so that interpolation methods may not be possible.

The column calibration factors will provide an additional, albeit lower improvement, since for lines in scanning (typically horizontal) direction there is an error averaging effect due to the "trotting mode" writing strategy (cf. FIG. 7) and for lines orthogonal to the scanning direction only local beamlets of the respective row and column contribute, which lie within the same area of the two-dimensional dose compensation map and are therefore expected to have an accurate dose value due to the dose correction map.

If all beamlets of the array were corrected by individual calibration factors (i.e. 512×512 factors for the above example), mainly the LCDU of lines orthogonal to the scanning direction and line edge and line width roughness in general would be improved, whereas the CD and LCDU values would not be significantly improved.

The invention claimed is:

1. Method for computing an exposure pattern for exposing a desired pattern on a target in a charged-particle lithography apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, said particle beam having a distribution of current dose for the plurality of blanking apertures of said aperture array, said method taking into account a deviation of said distribution from a nominal current dose value assumed to be constant over said plurality of blanking apertures, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images, wherein the position of aperture images is kept fixed relative to the target at the position of a pixel during an exposure interval, but between exposure intervals the position of aperture images is shifted over the target, thus exposing the multitude of pixels within said image area on the target, wherein the method comprises:

(i) providing a map of said distribution, correlating each aperture with a current factor, said current factor describing the current dose of the beam at the location of the respective aperture, (ii) providing the desired pattern and calculating a nominal exposure pattern as a raster graphics defined on the multitude of pixels, said nominal exposure pattern being suitable to create a nominal dose distribution on the target realizing contour lines of the desired pattern and including for each pixel a respective nominal dose value, (iii) calculating, for each pixel, a compensated dose value by dividing the respective nominal dose value by a compensation factor corresponding to the current factor of the aperture corresponding to the respective pixel, (iv) determining, for each pixel, a discrete value by selecting a value from the discrete gray scale which approximates the compensated dose value, and (v) generating, from the nominal exposure pattern, a compensated exposure pattern suitable to expose the desired pattern by said writing process by substituting the discrete values determined in step i for the nominal dose values.

2. The method according to claim 1, wherein the aperture images are mutually overlapping on the target, and the aperture images have a nominal width which is a multiple of the distance between pixel positions of neighboring aperture images on the target, and wherein in step iv, for a pixel where the corresponding compensated dose value falls between two values of the discrete gray scale, said compensated dose value is approximated by assigning at least two different values of the discrete gray scale to the aperture images affecting the respective pixel such that an average of the values thus assigned reproduces the compensated dose value within a predetermined dose error width.

3. The method of claim 2, wherein the predetermined dose error width is the difference of the two values of the discrete gray scale divided by square of the quotient of the aperture image nominal width divided by said distance between pixel positions of neighboring aperture images on the target.

4. The method according to claim 1, wherein the aperture images are mutually overlapping on the target, and the aperture images have a nominal width which is a multiple of the distance between pixel positions of neighboring aperture images on the target, and wherein in step iv, for a pixel where the corresponding compensated dose value falls between two values of the discrete gray scale, said compensated dose value is approximated by assigning at least two different values of the discrete gray scale to the aperture images affecting the respective pixel such that an average of the values thus assigned follows a stochastic probability distribution, said stochastic probability distribution having an expectation value which reproduces the compensated dose value.

5. The method of claim 1, wherein in step iv determining a discrete value is, for each pixel, performed by selecting a value which is arithmetically closest to the compensated dose value among the values within the discrete gray scale.

6. The method of claim 1, wherein at least steps iii through v, are performed during a writing process in real time, performing associated calculations transiently without permanent storing of the data calculated in said steps.

7. The method of claim 1, wherein the map is determined by means of a current measurement apparatus positioned in place of the target, while controlling the pattern definition device such that for each part of the map, which corresponds to the current dose value of specific blanking apertures respectively, only beam parts corresponding to the respective blanking apertures will propagate to the current measurement apparatus.

8. The method of claim 1, wherein the target has a sensitivity with an ageing function, wherein the map includes time-dependent values, having a time dependency corresponding to said ageing function.

9. The method of claim 1, wherein the map includes time-dependent values and wherein the particle beam is generated from a source having a total current, said time-dependent values having a time-dependency corresponding to a fluctuation function of the total current emitted from the source.

10. The method of claim 9, wherein the fluctuation function is updated by means of measuring the current of the beam using a current measurement apparatus.

11. The method of claim 1, wherein the discrete gray scale set is uniform for all aperture images and comprises evenly-spaced values from a predetermined minimum value to a predetermined maximum value.

12. The method of claim 1, wherein in step i, said map is realized as a numeric array of values $\alpha(r)$ describing a relative error of said distribution from the nominal current dose value, and in step iii dividing by the current factor is done by dividing by $(1+\alpha(r))$.

13. The method of claim 1, wherein the current factor comprises a row calibration factor, said factor being uniform for each row of apertures parallel to a scanning direction corresponding to the direction of time-averaged movement of the position of aperture images over the target.

14. The method of claim 13, wherein for each row the respective row calibration factor is determined by means of a current measurement apparatus positioned in place of the target, while controlling the pattern definition device such that only beamlets corresponding to the blanking apertures of the respective row will propagate to the current measurement apparatus, and by dividing the value thus measured by a common reference value.

15. The method of claim 13, wherein for each row the respective row calibration factor is determined by generating a line structure at the position of the target from the blanking apertures of the respective row, measuring a width of the line thus produced, and dividing said width by a reference width, wherein preferably the line structure is measured directly by a metrology device at the position of the target or the line structure is evaluated through writing a patterned line structure on a target, comprising at least one pattern line corresponding to said respective row, and measuring and comparing a contour width of said at least on pattern line.

16. The method of claim 1, wherein at least steps ii through v are performed during a writing process in real time, performing associated calculations transiently without permanent storing of the data calculated.

* * * * *